(12) United States Patent
Laermer

(10) Patent No.: US 10,497,543 B2
(45) Date of Patent: Dec. 3, 2019

(54) DEVICE FOR ANISOTROPICALLY ETCHING A SUBSTRATE, AND METHOD FOR OPERATING A DEVICE FOR ANISOTROPICALLY ETCHING A SUBSTRATE

(71) Applicant: Robert Bosch GmbH, Stuttgart (DE)

(72) Inventor: Franz Laermer, Weil der Stadt (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/502,453

(22) PCT Filed: Jul. 6, 2015

(86) PCT No.: PCT/EP2015/065298
§ 371 (c)(1),
(2) Date: Feb. 7, 2017

(87) PCT Pub. No.: WO2016/023683
PCT Pub. Date: Feb. 18, 2016

(65) Prior Publication Data
US 2017/0221732 A1    Aug. 3, 2017

(30) Foreign Application Priority Data

Aug. 14, 2014  (DE) ........................ 10 2014 216 195

(51) Int. Cl.
*H01J 37/32* (2006.01)
*H01L 21/3065* (2006.01)
*H01L 21/67* (2006.01)

(52) U.S. Cl.
CPC ...... *H01J 37/32449* (2013.01); *H01J 37/321* (2013.01); *H01J 37/32357* (2013.01);
(Continued)

(58) Field of Classification Search
CPC ........ C23C 16/45514; C23C 16/45587; C23C 16/45591; H01J 37/321–32119;
(Continued)

(56) References Cited

U.S. PATENT DOCUMENTS 5,105,761 A * 4/1992 Charlet ............... H01J 37/3244
118/719
5,501,893 A   3/1996 Laermer et al.
(Continued)

FOREIGN PATENT DOCUMENTS

CN      1875453 A    12/2006
JP   2000-31126 A     1/2000
(Continued)

OTHER PUBLICATIONS

International Search Report corresponding to PCT Application No. PCT/EP2015/065298, dated Sep. 7, 2015 (German and English language document) (7 pages).

*Primary Examiner* — Benjamin Kendall
(74) *Attorney, Agent, or Firm* — Maginot, Moore & Beck LLP

(57) ABSTRACT

A device for etching a substrate includes a first reaction chamber into which a first gas is introduced; a second reaction chamber into which a second gas is introduced; and a coil device that generates an electromagnetic alternating field. At least one first reactive species is generated by applying the electromagnetic alternating field to the first gas and at least one second reactive species is generated by applying the electromagnetic alternating field to the second gas. The device further includes a separating device that prevents a direct gas exchange between the first and second reaction chambers; an etching chamber configured to receive the substrate to be anisotropically etched; and a mixing device configured such that the reactive species enter the mixing device, are mixed together, and in the mixed state act on the substrate so as to anisotropically etch the substrate in the etching chamber.

10 Claims, 13 Drawing Sheets

(52) U.S. Cl.
CPC .. *H01J 37/32422* (2013.01); *H01J 37/32513*
(2013.01); *H01J 37/32724* (2013.01); *H01L*
*21/30655* (2013.01); *H01L 21/67017*
(2013.01); *H01L 21/67069* (2013.01); *H01J*
*2237/334* (2013.01); *H01J 2237/3341*
(2013.01)

(58) Field of Classification Search
CPC ........... H01J 37/32357; H01J 37/32422; H01J
37/32449; H01J 37/32513; H01J
37/32724; H01J 2237/334; H01J
2237/3341; H01L 21/30655; H01L
21/67017; H01L 21/67069; H05H
2001/4652–4667
See application file for complete search history.

(56) References Cited

U.S. PATENT DOCUMENTS

| | | | | |
|---|---|---|---|---|
| 6,162,323 | A * | 12/2000 | Koshimizu | H01J 37/3244 |
| | | | | 118/723 I |
| 6,287,643 | B1 | 9/2001 | Powell et al. | |
| 2002/0162629 | A1* | 11/2002 | Jeon | H01J 37/321 |
| | | | | 156/345.35 |
| 2002/0185226 | A1* | 12/2002 | Lea | H01J 37/32357 |
| | | | | 156/345.35 |
| 2004/0134615 | A1 | 7/2004 | Breitschwerdt et al. | |
| 2007/0158305 | A1* | 7/2007 | Cooke | H01J 37/32623 |
| | | | | 216/67 |
| 2008/0064220 | A1* | 3/2008 | Fernandez | H01J 37/32091 |
| | | | | 438/706 |
| 2009/0244471 | A1 | 10/2009 | Kondo | |
| 2010/0206231 | A1* | 8/2010 | Yoon | H01J 37/32357 |
| | | | | 118/723 I |
| 2012/0006490 | A1* | 1/2012 | Yamamoto | H01J 37/321 |
| | | | | 156/345.48 |
| 2014/0011370 | A1 | 1/2014 | Kato et al. | |
| 2014/0352889 | A1* | 12/2014 | Ansell | H01J 37/32357 |
| | | | | 156/345.35 |
| 2015/0136734 | A1* | 5/2015 | Chae | H01J 37/32449 |
| | | | | 216/67 |

FOREIGN PATENT DOCUMENTS

| | | | |
|---|---|---|---|
| JP | 2000-091320 A | | 3/2000 |
| JP | 2000091320 A | * | 3/2000 |
| WO | 03/060975 A1 | | 7/2003 |
| WO | 2011/030721 A1 | | 3/2011 |

\* cited by examiner

Fig. 7f1
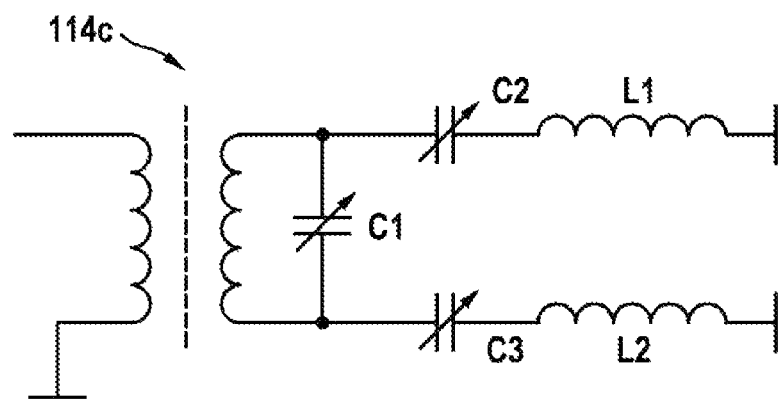
Fig. 7f2
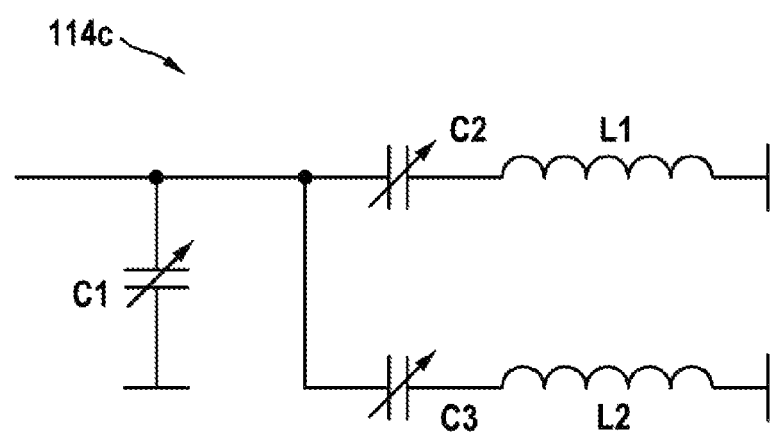

DEVICE FOR ANISOTROPICALLY ETCHING A SUBSTRATE, AND METHOD FOR OPERATING A DEVICE FOR ANISOTROPICALLY ETCHING A SUBSTRATE

This application is a 35 U.S.C. § 371 National Stage Application of PCT/EP2015/065298, filed on Jul. 6, 2015, which claims the benefit of priority to Serial No. DE 10 2014 216 195.9, filed on Aug. 14, 2014 in Germany, the disclosures of which are incorporated herein by reference in their entirety.

The disclosure relates to a device for anisotropically etching a substrate, in particular a silicon substrate, preferably an 8 inch or 200 mm silicon wafer, and a method for operating the device according to the disclosure.

Fluorine-based high rate etching processes for silicon, so-called DRIE processes, require both silicon-etching fluorine radicals and also Teflon-forming species, so-called passivation species, which passivate side walls of silicon structures and protect them from an etching attack or undercutting by the spontaneously acting, highly-reactive fluorine radicals. The fluorine radicals and the Teflon-forming species are generated in a plasma. However, they generally do not coexist therein, but rather mutually extinguish one another in the plasma due to recombination reactions.

A method is described in U.S. Pat. No. 5,501,893, according to which etching and passivation steps are chronologically separated from one another during the etching of a substrate. Due to the chronological separation, a contact of the two species is avoided, so that etching and passivation can be performed independently of one another.

SUMMARY

Accordingly, a device is provided for anisotropically etching a substrate, comprising a first reaction chamber, into which a first gas is introducible; a second reaction chamber, into which a second reaction gas is introducible; at least one coil unit, by means of which at least one electromagnetic alternating field can be generated; wherein at least one first reactive species can be generated by applying the generated at least one electromagnetic alternating field to the introduced first gas in the first reaction chamber, and wherein at least one second reactive species can be generated by means of applying the generated at least one electromagnetic alternating field to the introduced second gas in the second reaction chamber; a separating unit, by means of which a direct gas exchange between the first reaction chamber and the second reaction chamber is suppressed; an etching chamber for accommodating the substrate to be anisotropically etched; and a mixing unit, which is arranged and designed such that the generated at least one first reactive species and the generated at least one second reactive species enter the mixing unit during a movement from the two reaction chambers in the direction of the etching chamber, mix with one another therein, and enter the etching chamber for anisotropically etching the substrate while mixed with one another.

Furthermore, a method for operating a device according to the disclosure is provided, comprising the following steps: introducing the first gas into the first reaction chamber; introducing the second gas into the second reaction chamber simultaneously with the introduction of the first gas into the first reaction chamber; and generating the at least one electromagnetic alternating field to generate the at least one reactive species from the first gas and to generate the at least one second reactive species from the second gas.

The finding on which the disclosure is based is that an undesired recombination of silicon-etching fluorine radicals and passivating, i.e., Teflon-forming species can be overcome if they do not already mix in a reaction region of a high-density plasma of a plasma source, i.e., at the location of the occurrence of the respective species, but rather first mix outside the plasma generation or plasma reaction zones. If the generation of Teflon-forming species from a passivation gas and the generation of the silicon-etching fluorine radicals from an etching gas are spatially separated from one another, an anisotropic etching result having very high etching rates and mask selectivity can already be achieved using a comparatively small proportion of the passivation gas in relation to the etching gas without disadvantages in relation to a discontinuous method. The harmlessness which is surprising per se of mixing the plasma products, i.e., the Teflon-forming passivation species and the silicon-etching fluorine radicals as the etching species, outside the respective occurrence zones is based on a sufficiently long chain length of the plasma-polymerized Teflon-forming species and fundamentally enables a continuously operating fluorine-based high rate etching process for silicon, in which the chronological separation of the species is replaced by a spatial separation in the region of the reaction regions or occurrence zones of the species.

The fundamental concept of the disclosure is to take this finding into consideration and to provide a device which has separate reaction chambers as the reaction region for the generation of the Teflon-forming species from the passivation gas, on the one hand, and the generation of the silicon-etching fluorine radicals from the etching gas, on the other hand. The device has the described mixing unit for the suitable anisotropic etching of the substrate, by means of which the separately generated reactive species can advantageously be mixed with one another before they are incident on the substrate for the anisotropic etching. Mixing of both species is advantageous to achieve the most uniform possible, i.e., homogeneous etching results over the entire area of the silicon wafer to be processed.

Uncharged reactive species follow, on the path thereof from the respective reaction region thereof, i.e., the generation region, into the etching chamber to act on the substrate, i.e., to anisotropically etch the substrate, the respective gas flows, in particular gas flows which are based on strengths with which the first and the second gas are introduced into the first and the second reaction chambers.

The Teflon-forming reactive species are capable of synthesizing a Teflon-like protective film on a surface of the substrate to be etched, in particular on side walls of structures etched into the substrate by means of the fluorine radicals, which protects the side walls from an attack by the fluorine radicals. The Teflon-like protective film is also referred to in short as a Teflon film, side film, or side wall film. The Teflon-forming reactive species generated in the passivation plasma advantageously have a minimum size or minimum length, also referred to as a minimum chain length, to be able to condense on the substrate and cross-link thereon to form the Teflon film. 10 to 100 carbon atoms per molecule of the Teflon-forming reactive species are preferred. The molecules of the Teflon-forming reactive species can have the form $(CF_n)_m$, for example, wherein m can be greater than 9 and less than 101 and n can be between 0 and 3, wherein the case of n being equal to 2 is preferred and/or is the typical stoichiometry of a Teflon chain.

Advantageous embodiments and refinements result from the dependent claims and from the description with reference to the figures.

According to a first preferred refinement, the mixing unit has a guide unit, which tapers in a funnel shape in the direction of the etching chamber, in particular in the shape of a hollow truncated cone, for mixing and/or guiding the at least one first reactive species and at least one second reactive species, which are mixed with one another, toward the substrate. In this way, the two reactive species can be mixed better with one another and can be guided in a targeted manner onto the substrate.

According to a further preferred refinement, the mixing unit has at least one first redirection unit, by means of which, to redirect at least a part of the generated at least one first reactive species, a direct path of the generated at least one first reactive species from the first reaction chamber to the substrate is partially or completely blocked. Gas flows of the reactive species can be formed in this way so that particularly homogeneous mixing of the different species takes place outside, in particular below the generation zones of the respective reaction chambers. In particular, the first redirection unit can be arranged such that gas streams of the first reactive species and the second reactive species are oriented one into another, whereby a substantially more rapid and complete thorough mixing results over a shorter path section. The redirection unit is preferably manufactured from a dielectric material, for example, quartz glass.

According to a further preferred refinement, the mixing unit is designed as a diffusion section. A diffusion section is understood as a runway of the gases or reactive species between the reaction chambers or generation regions, on the one hand, and the actual etching chamber, on the other hand. I.e., a path section which the gaseous reactive species have to overcome after the generation thereof before they reach the substrate in the etching chamber and via which they can advantageously thoroughly mix with one another by way of inter-diffusion procedures.

According to a further preferred refinement, at least one first subregion of the first reaction chamber is completely enclosed by at least one second subregion of the second reaction chamber. The first reaction chamber can advantageously also be completely enclosed by the second subregion of the second reaction chamber. The first and the second reaction chambers are particularly advantageously embodied as rotationally-symmetrical dielectric vessels, in particular each having a form of a hollow cylinder, which are concentrically nested in one another. The first reaction chamber is advantageously located closer to the shared virtual axis than the second reaction chamber and/or comprises a smaller volume than the second reaction chamber. In the axial direction of the virtual axis, for example, the first and second reaction chambers can terminate flush with one another at both axial ends or can terminate flush at one axial end and can extend to different distances in the axial direction at the other, opposing end. The device can thus be designed in a particularly space-saving manner and components of the device, for example, the coil units generating the electromagnetic alternating fields, can be usable jointly for the first and the second reaction chambers.

According to a further preferred refinement, the coil unit has a first inductive coil, which is designed to apply a first electromagnetic alternating field to the first reaction chamber; and furthermore a second inductive coil, which is designed to apply a second electromagnetic alternating field to the second reaction chamber. The application of the electromagnetic alternating field to the two reaction chambers can also be referred to as coupling a first high frequency into the first reaction chamber and a second high frequency into the second reaction chamber. The inductive coils can be designed to generate electromagnetic fields identical to one another, or electromagnetic fields different from one another, for example, with reference to intensity, flux density, etc. By separately generating the two electromagnetic alternating fields, an intensity of a high-frequency power coupled into the respective reaction chamber can be controllable separately and therefore can be adapted or optimized individually for the respective generation of the reactive species.

According to a further preferred refinement, the first reaction chamber has a first inlet line for introducing the first gas into the first reaction chamber, wherein the first inlet line is connected via a first valve unit to a first gas tank and to a second gas tank, wherein the first valve unit is controllable to introduce either a first gas species provided in the first gas tank or a second gas species provided in the second gas tank as the first gas into the first reaction chamber. According to a further preferred refinement, the second reaction chamber has a second inlet line for introducing the second gas into the second reaction chamber, wherein the second inlet line is connected via a second valve unit to the first gas tank and to the second gas tank, wherein the second valve unit is controllable to introduce either the first gas species provided in the first gas tank or the second gas species provided in the second gas tank as the second gas into the second reaction chamber.

In this way, it is possible to introduce either a passivation gas or an etching gas into the first reaction chamber and/or to introduce either an etching gas or a passivation gas into the second reaction chamber, in particular automatically and without having to perform a manual reconfiguration for this purpose. Both variants for the supply of the two gases can result in specific inhomogeneities with respect to the resulting species composition, which can be advantageous or disadvantageous, in spite of a subsequent thorough mixing of the two generated reactive species up to the location of the substrate to be etched. By switching over between the two supply variants during an etching process, this inhomogeneity can be reduced by an "averaging effect". Alternatively, one supply variant can be intentionally selected so that other process-related inhomogeneities are corrected by the inhomogeneity thus caused. For example, it can be advantageous in a silicon etching process if the passivation gas is generated further outward than the etching gas, in relation to the radial direction, on a surface normal of a surface to be etched of the wafer to be etched. This generally results in a somewhat higher proportion of passivating, i.e., Teflon-forming species in edge regions, again in the radial direction, of the etching chamber and of the substrate to be etched. For example, fluorine-based silicon etching processes frequently tend toward an etching rate increase over the silicon wafer as the substrate from the wafer center to the wafer edge, because silicon, which consumes fluorine radicals, is no longer available outside the silicon wafer, i.e., beyond its edge.

As a result of this, a higher concentration of silicon-etching fluorine radicals is available in the edge regions of the silicon wafer than in the wafer center, which is enclosed completely by silicon to be etched. A targeted increase of the density of the film-forming reactive species in the edge region of the silicon wafer in relation to the wafer center can at least partially compensate for such an effect and can ensure better uniformity of the etching results. A process-related etching rate increase from the wafer center toward the wafer edge is therefore reduced with this setting.

In contrast, if one intends a change of the gas supply variant during a process or between various processes, an actuation of the first and/or second valve units can thus be performed pneumatically or electromagnetically, for example. The first and the second valve units can be designed as two coupled three-way valves, which each alternately switch the relevant first or second gas into the first or the second reaction chamber as a Y-valve. The switching of the first and second valve units can be performed by means of a control unit of the device according to the disclosure.

According to a further preferred refinement, the device has a temperature-control unit, by means of which the substrate can be brought to a predefined operating temperature and held at the predefined operating temperature. The temperature-control unit is advantageously designed to bring and hold the substrate to the predefined operating temperature between 20° C. and 90° C., advantageously between 30° and 80° C., particularly advantageously between 40° C. and 70° C., each inclusive. The temperature-control unit can comprise for this purpose a so-called "heater chiller" using deionized water, silicone oils or fluorocarbons as the heat-transport medium to the substrate electrode and/or a helium wafer rear side cooler as the heat-contact medium between wafer, i.e. substrate, and substrate electrode. By means of the operating temperature of the wafer, a condensation threshold is predefinable, which describes a minimum chain length of the passivation species which has to be exceeded to condense the passivation species on the substrate. Together with a preferred generation of particularly long-chain passivation species, the preferred formation of a particularly soft and loosely cross-linked film morphology of the Teflon film on the substrate can thus be achieved, in that, for example, at higher wafer temperature, only relatively long-chain Teflon-film-forming species can condense on the wafer and cross-link thereon.

According to one preferred refinement of the method according to the disclosure, a passivation gas or an etching gas is introduced as the first gas and an etching gas is introduced as the second gas if a passivation gas is introduced as the first gas, and a passivation gas is introduced as the second gas if an etching gas is introduced as the first gas. The passivation gas is advantageously a fluorinated hydrocarbon, a perfluorinated alkene, in particular perfluoropropene, or a perfluorinated alkyne. A cyclic perfluorinated alkane is particularly preferred, in particular octafluorocyclobutane. Furthermore, above all Teflon-forming monomers preferably having low fluorine to carbon ratio, in particular two to one or less, which are generated from passivation gases or other fluorocarbons or fluorinated hydrocarbons come into consideration as the passivation species. The etching gas is advantageously sulfur hexafluoride, nitrogen trifluoride, chlorine trifluoride, and/or bromine trifluoride, particularly preferably sulfur hexafluoride.

According to a further preferred refinement, the method comprises switching over at least once at a predetermined switching frequency between a first operating mode and a second operating mode, wherein an etching gas is introduced as the first gas and a passivation gas is introduced as the second gas in the first operating mode, and wherein a passivation gas is introduced as the first gas and an etching gas is introduced as the second gas in the second operating mode. The switching frequency can be in particular between 10 Hz and 3 mHz. A switching frequency between 1 Hz and 30 mHz is particularly advantageously selected, particularly preferably a switching frequency between 100 mHz and 50 mHz. The set gas flows of the etching gas and the passivation gas do not have to be varied in this case, because, for example, by means of the above-described two valve units, in particular three-way or Y-valves, it is possible to switch over between a supply to the first reaction chamber and a supply to the second reaction chamber. Alternatively, it is also possible to change the gas flows of the first and the second gases, i.e., the etching gas and the passivation gas, synchronously with the switching procedures. For example, the gas flows of the first and the second gases can be adapted to different spatial volume conditions of the first and the second reaction chambers, to obtain and maintain the most stable possible plasma conditions in the respective reaction chambers. The option of switching over the process gases between the reaction chambers during a process or between various processes enables a harmful accumulation of Teflon film material in the reaction chambers themselves to be avoided, in that an occurring chamber coating is regularly etched away again. A release of undesired particles is thus avoided.

The alternating fields which are applied to the respective reaction chambers can also advantageously be adapted to the introduced gas. For example, to generate plasma polymers having the longest possible chains from the passivation gas, the alternating field which is applied to the passivation gas can have a higher power than the alternating field which is applied to the etching gas, in particular a power between 30% and 200% higher, preferably a power between 40% and 100% higher, particularly preferably a power between 45% and 70% higher.

The alternating switching over of the etching and the passivation gases between the first and the second reaction chambers results in a homogeneity which is improved in the chronological average of the mixture of the etching and passivation species mixed with one another after the traversal of the mixing unit up to the location of the substrate. By regularly or intentionally switching over from the first operating mode into the second operating mode or vice versa, a particle formation on inner walls of the first and second reaction chambers can be avoided.

BRIEF DESCRIPTION OF THE DRAWINGS

The disclosure will be explained in greater detail hereafter on the basis of the exemplary embodiments, which are illustrated in greater detail in the schematic figures of the drawings. In the figures:

FIG. 7a to FIG. 7f2 show various design forms for powering one or more inductive coils of a device according to the disclosure;

In all figures, identical or functionally-identical elements and devices—if not otherwise indicated—are provided with the same reference signs.

DETAILED DESCRIPTION

Figure 1:
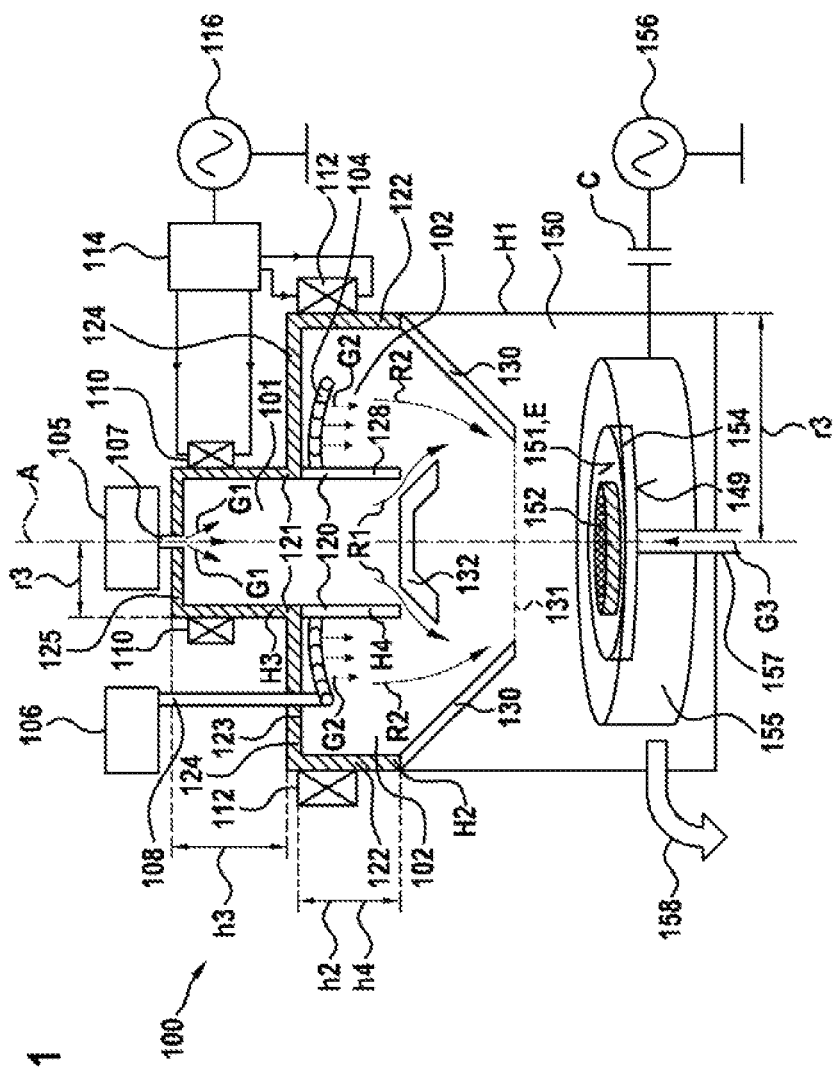
FIG. 1 shows a schematic cross-sectional view through a device for anisotropically etching a substrate according to a first embodiment of the disclosure.

FIG. 1 shows a schematic cross-sectional view through a device 100 for anisotropically etching a substrate 152 according to a first embodiment of the disclosure. The substrate 152 to be etched, in the present example a silicon substrate, can be laid on a first outer surface 151 of an electrostatic chucking device 154 of a carrier 155. The carrier 155 is connected via an adaptation network, schematically shown in simplified form as a capacitor C, to a first high-frequency AC voltage generator 156, by means of which a first high-frequency AC voltage can be applied to the carrier 155. Helium gas, as a heat contact medium for the thermal coupling of the substrate 152, can be conducted to a second outer surface 149 of the carrier section 154 via a cooling feed line 157, which can be part of a more extensive temperature-control unit. The second outer surface 149 of the chucking device 154 is parallel to the first outer surface 151 of the chucking device 154. The carrier 155 is held at the desired preset temperature by means of a liquid cooling circuit and is arranged in an etching chamber 150, out of which gas can be pumped by means of a pumping unit 158.

The first outer surface 151 of the chucking unit 154 is located completely in a virtual plane E, the surface normal of which is parallel to a virtual axis A, which is a rotational-symmetry axis of the carrier 155. Essentially, that is to say except for a few unimportant exceptions, which are given, for example, by the pump unit 158 or electrical connections between the carrier 155 and the first high-frequency alternating current generator and the corresponding electrical lines, the etching chamber 150 is also rotationally symmetrical about the virtual axis A of the carrier 155. Where "inner" and "outer" is referred to hereafter, this is explicitly not to describe anything other than "inner" is always to be understood as a position located closer to the virtual axis A in the radial direction in relation to the virtual axis A and "outer" is always to be understood as a position located farther away from the virtual axis A in the radial direction in relation to the virtual axis A. For example, an inner surface is to be understood as a surface facing toward the virtual axis and an outer surface is to be understood as a surface facing away from the virtual axis.

The etching chamber 150 essentially has the form of a first hollow cylinder H1, which is closed on one side in the axial direction. At the open end of the first hollow cylinder H1, it is adjoined by a second hollow cylinder H2, which is closed on one side in the axial direction by means of a cover surface 123, having a lateral surface 122. A lateral surface is also to be understood as a wall having finite thickness.

The lateral surface 122 of the second hollow cylinder H2 can comprise or consist, for example, of aluminum oxide ceramic or quartz glass. In the case of ceramic, a "green body" can be cast or molded in the required geometry and subsequently fired/sintered.

The axial cover surface 123 of the second and, indirectly, also the first hollow cylinder H2, H1 is not completely planar, but rather comprises a planar circular ring disk 124, from which a third hollow cylinder H3, which is closed on one side in the axial direction, having a lateral surface 121, having a radius r3 and a cylinder height h3, is extruded as part of the cover surface 123. The third hollow cylinder H3 is rotationally symmetrical about the virtual axis A and is arranged concentrically with the circular ring disk 124, which is also rotationally symmetrical about the virtual axis A. The third hollow cylinder H3 is open in the direction of the etching chamber 150.

A separating unit 120 is inserted into the second hollow cylinder H2 where the outer walls 121 of the third hollow cylinder adjoin the circular ring disk 124 of the cover surface 123. The separating unit 120 is designed as a fourth hollow cylinder H4, which is open on both sides in the axial direction, having the same or a similarly large cylinder radius r3 as the third hollow cylinder H3. The cylinder radius r3 of the third hollow cylinder H3 is smaller than the cylinder radius r1 of the second hollow cylinder H2, which can be equal to the cylinder radius r1 of the first hollow cylinder H1. The fourth hollow cylinder H4 has a lateral surface 128 and a cylinder height h1, which can be equal to a cylinder height h2 of the second hollow cylinder H2.

The interiors of the third and the fourth hollow cylinders H3, H4 together form a first reaction chamber 101. The first reaction chamber 101 therefore comprises a cylindrical volume having the radius r3 and a cylinder height, which is the total of the cylinder height h3 of the third hollow cylinder H3 and the cylinder height h4 of the fourth hollow cylinder H4. A volume between the inner surface of the lateral surface 122 of the second hollow cylinder H2 and the outer surface of the lateral surface 128 of the fourth hollow cylinder H4 forms a second reaction chamber 102. Neglecting wall thicknesses, the volume of the second reaction chamber 102 is the product of the cylinder height h2, the number pi, and the difference of the squares of the cylinder radii r1 and r3.

By means of the separating unit 120, a direct gas exchange, i.e., in particular a gas exchange on a direct path, between the first reaction chamber 101 and the second reaction chamber 102 is structurally suppressed in the region of the plasma generation zone. A direct path to be understood in particular as a path along a straight line. A leakage gas exchange, which is to be neglected, and which is based on incomplete leak tightness between the first reaction chamber 101 and the second reaction chamber 102 at the transition between the separating unit 120 and the third hollow cylinder 103, can be tolerated.

The separating unit 120 can be formed from ceramic materials or quartz glass or can comprise such materials. The cover surface 123 and the separating unit 120 can advantageously also be produced from a single ceramic cast part, wherein a "green body" can be cast in the required shape, molded, and subsequently sintered. Individual ceramic parts can also be welded to one another to form the separating unit 120 and/or the cover surface 123. The cover surface 123 can furthermore also be formed as a flange made of, for example, aluminum or stainless steel. The ceramic parts can be attached to the first inlet line 107 by means of a closure surface 125, which closes the hollow cylinder at its axial end facing away from the etching chamber 150 and which can be formed as a flange. The flange can be formed from aluminum or stainless steel, for example. Seals can be used at all points where gas leak-tightness is required.

By means of a first inlet line 107, which is arranged in the center of the closure surface 125, which axially closes the third hollow cylinder H3 on one side, a first gas G1 from a first gas tank 105 can be conducted into the first reaction chamber. In the second reaction chamber 102, a gas distributor ring 104 is arranged, which is adapted to the shape of the second reaction chamber 102 and which is therefore circular according to the first embodiment, and which tangentially encloses the separating unit 120, wherein the gas distributor ring 104 is spaced apart both from the lateral surface 122 and also from the separating unit 120. The gas distributor ring 104 is arranged rotationally symmetrically about the virtual axis A and concentrically to the second and the fourth hollow cylinder H2, H4. By means of a second inlet line 108, a second gas G2 can be guided from a second gas tank 106 into the gas distributor ring 104, whereby the gas G2 can be introduced uniformly into the second reaction chamber 102 over the entire circumference of the second reaction chamber 102. Additionally or alternatively to the gas distributor ring 104, the introduction of the second gas G2 into the second reaction chamber 102 can also be performed by means of gas inlets arranged radially in the lateral surface 122 of the second hollow cylinder H2 or in the cover surface 123, which advantageously have a $C_n$ symmetry group, for example, $C_3$, $C_4$, etc.

Outside the third hollow cylinder H3, and enclosing it tangentially, a first inductive coil 110 is arranged. Outside the second hollow cylinder H3, and enclosing it tangentially, a second inductive coil 112 is arranged. Both inductive coils 110, 112 are rotationally symmetrical about the virtual axis A.

By means of the first coil 110, by generating a first electromagnetic alternating field in the first reaction chamber 101, the first gas G1 can be excited in the first reaction chamber 101 to form a first inductively coupled plasma. For example, octafluorocyclobutane (having the structural formula c-$C_4F_8$, a passivation gas) is introducible as the first gas G1 into the first reaction chamber 101. Teflon-forming first reactive species R1, which preferably have long-chain molecules, are formed by plasma polymerization in the generated high-density first plasma in the first reaction chamber 101. Longer polymer chains generally result in a softer, more loosely cross-linked film morphology of a Teflon film on the substrate 152 to be etched. The removal of such a Teflon film from the etching ground requires less ion action than the removal of a Teflon film formed by shorter polymer chains. The etching process is therefore dominated more chemically overall than physically, i.e., more by spontaneous etching reactions of the fluorine radicals on the etching ground than by ion action. Advantageously high etching rates and a high selectivity in relation to the mask thus result. The condensation of the Teflon-forming reactive species on the wafer can advantageously be performed by selecting a suitable temperature control of the substrate 152, for example, by the temperature-control unit.

By means of the second coil 112, by generating a second electromagnetic alternating field in the second reaction chamber 102, the second gas G2 can be excited in the second reaction chamber 102 to form a second inductively coupled plasma. For example, sulfur hexafluoride (having the structural formula $SF_6$, an etching gas) is introducible as the second gas into the second reaction chamber 102. Fluorine radicals are therefore generated as the second reactive species R2 in the generated high-density second plasma. The first and the second coils 112 are powered for this purpose via an electrical adaptation unit 114 (English: "matching unit" or "matchbox", also called high-frequency adaptation networks in German), which is electrically connected to a high-frequency generator unit 116, to apply a respective electromagnetic alternating field to the first and the second reaction chambers 101, 102. An ion acceleration, i.e., an acceleration of charged particles generated in the plasma, so-called ions, toward the substrate 152 to be etched, is achievable by the application of the first high-frequency AC voltage to the carrier 155.

On the path from the first and second reaction chambers 101, 102, the two reactive species R1, R2 enter the mixing unit 130, 132, which is designed for better mixing of the first and second reactive species R1, R2. The mixing unit 130, 132 comprises a guide unit 130, which tapers in a funnel shape in the direction of the etching chamber 150 and is in the shape of a hollow truncated cone, for guiding the first reactive species R1 and the second reactive species R2, which were mixed with one another, toward the substrate 152. The mixing unit 130, 132 is advantageously manufactured from a dielectric material, whereby manufacturing from metal is also conceivable.

Furthermore, the mixing unit 130, 132 comprises a redirection unit 132, which is spatially arranged between the first reaction chamber 101 and the etching chamber 150, for redirecting at least a part of the first reactive species R1. By means of the redirection unit 132, a direct path of the first reactive species R1 from the first reaction chamber R1 to the substrate 152 is completely blocked. The redirection unit 132 is a baffle plate arranged rotationally symmetrically about the virtual axis A and has a trapezoidal cross section, which widens in the direction of the etching chamber 150, in a plane in which the virtual axis A is located. By means of the redirection unit 132, the first reactive species R1 is guided in the radial direction, in relation to the virtual axis A, outward into a stream of the second reactive species R2, whereby the mixing of the first and second reactive species R1, R2 is improved. The first and second reactive species R1, R2, which are mixed with one another, enter the etching chamber 150 through an opening 131 in the guide unit 130 and are oriented and/or channeled toward the substrate 152.

Figure 1A:
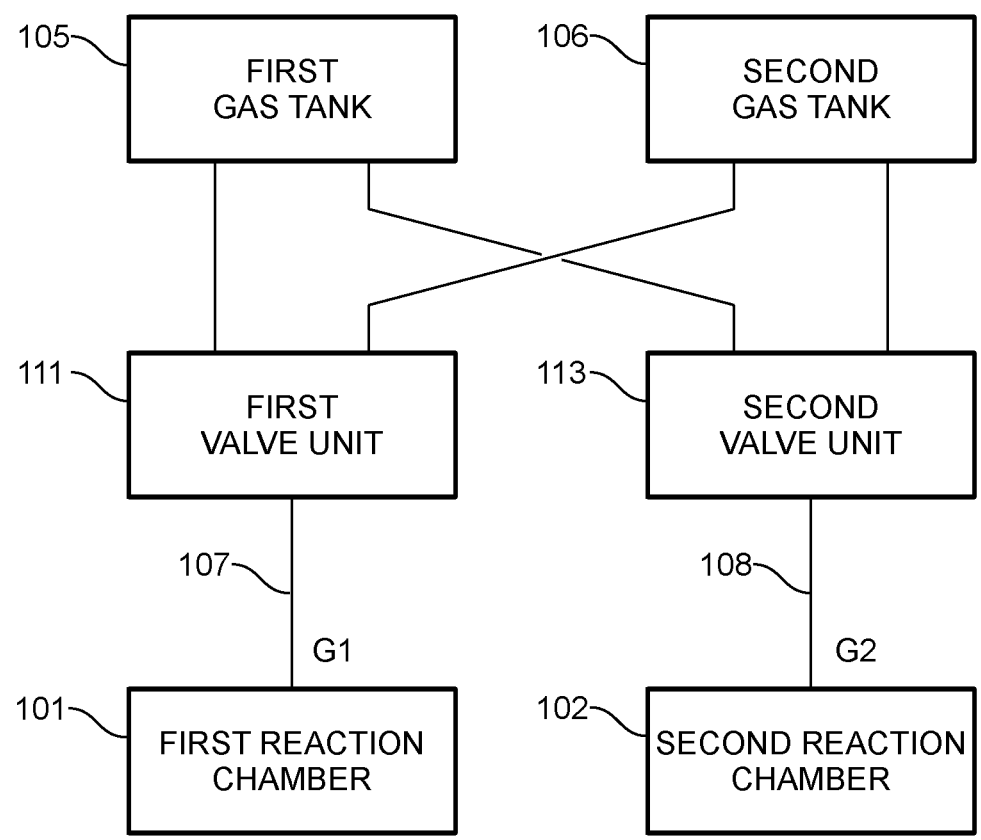
FIG. 1a shows a schematic diagram of a device for anisotropically etching a substrate according to an embodiment of the disclosure.

According to a further preferred refinement illustrated in FIG. 1a, the first reaction chamber 101 has a first inlet line 107 for introducing the first gas G1 into the first reaction chamber 101. The first inlet line 107 is connected via a first valve unit 111 to a first gas tank 105 and to a second gas tank 106. The first valve unit 111 is controllable to introduce either a first gas species provided in the first gas tank 105 or a second gas species provided in the second gas tank 106 as the first gas G1 into the first reaction chamber 101. The second reaction chamber 102 has a second inlet line 108 for introducing the second gas G2 into the second reaction chamber 102. The second inlet line 108 is connected via a second valve unit 113 to the first gas tank 105 and to the second gas tank 106. The second valve unit 113 is controllable to introduce either the first gas species provided in the first gas tank 105 or the second gas species provided in the second gas tank 106 as the second gas G2 into the second reaction chamber 102.

Figure 2:
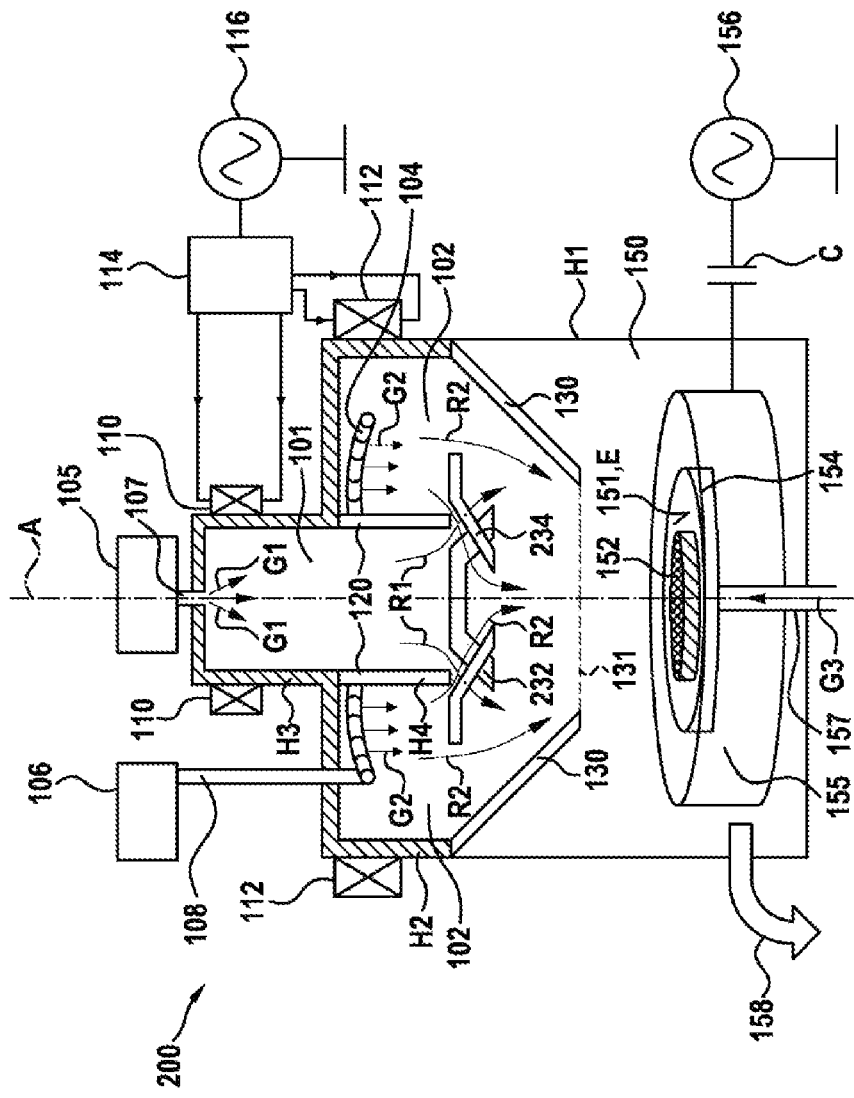
FIG. 2 shows a schematic cross-sectional view through a device for anisotropically etching a substrate according to a second embodiment of the disclosure.

FIG. 2 shows a schematic cross-sectional view through a device 200 for anisotropic etching of a substrate 152 according to a second embodiment of the disclosure. The device 200 according to the second embodiment is a variant of the device 100 according to the first embodiment and differs therefrom in the design of the mixing unit 130, 232, 234.

Instead of the redirection unit 132, the mixing unit 130, 232, 234 according to the second embodiment has a first redirection unit 232 and a second redirection unit 234. The first redirection unit 232 is a variant of the redirection unit 132, which, instead of a rotational symmetry, has a $C_n$ symmetry about the virtual axis A, because in contrast to the redirection element 132, individual circular segments are removed from the cross section—viewed from the axial direction of the virtual axis A—of the first redirection unit 232. A circular segment of the second redirection unit 234 engages in a fitted manner in each of the gaps resulting due to the removal of the circular segments. The basic shape of the second redirection unit 234 is a funnel which is shaped like a hollow truncated cone, and which tapers in the direction of the etching chamber 150 and is rotationally symmetrical about the virtual axis A, and which instead of a rotational symmetry, has a $C_n$ symmetry, because circular segments are also removed from the cross section—observed from the axial direction of the virtual axis A—of the second redirection element 232. A circular segment of the first redirection unit 232 engages in a fitted manner in each of the gaps resulting due to the removal of the circular segments from the second redirection unit 232 and vice versa. The circular segments of the first and/or the second redirection unit 232, 234 are preferably designed as quarter, sixth, eighth, tenth, twelfth circular segments, etc. That is to say, the first and/or the second redirection unit 232, 234 preferably has a $C_{2m}$ symmetry with respect to the virtual axis A, wherein m is a whole number, preferably a whole number between one and six.

By means of the second redirection unit 234, a part of the generated second reactive species R2 is guided between the separating unit 120 and the second redirection element 234 in the radial direction toward the virtual axis A through the gaps in the first redirection unit 232. By means of the first redirection unit 232, a part of the generated first reactive species R1 is guided further between the separating unit 120 and the first redirection unit 232 in the radial direction from the virtual axis A through the gaps in the second redirection unit 234. In this way, the mixing of the two reactive species R1, R2 on the path from the two reaction chambers 101, 102 to the substrate 152 is improved.

Figure 3:
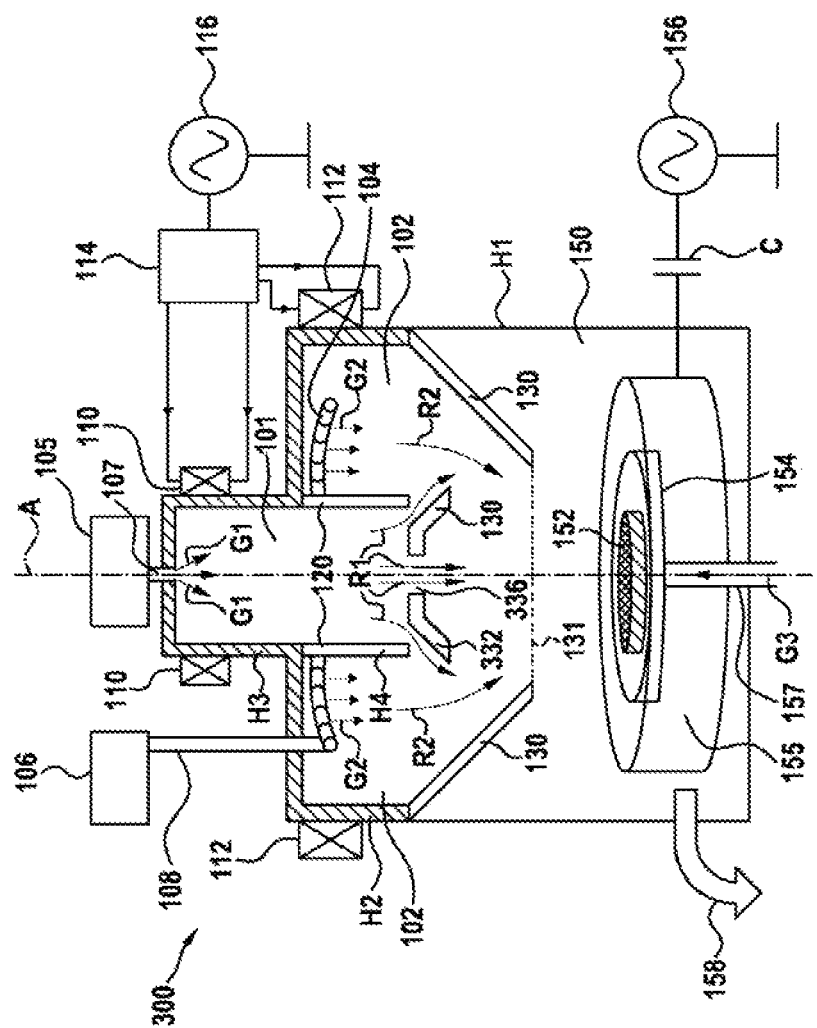
FIG. 3 shows a schematic cross-sectional view through a device for anisotropically etching a substrate according to a third embodiment of the disclosure.

FIG. 3 shows a schematic cross-sectional view through a device 300 for anisotropically etching a substrate 152 according to a third embodiment of the disclosure. The device 300 according to the third embodiment is a variant of the device 100 according to the first embodiment and differs therefrom in the design of the mixing unit 130, 332.

The redirection unit 332 according to the third embodiment is a variant of the redirection unit 132 according to the first embodiment and furthermore has in comparison thereto an opening 336 in the region of the virtual axis A, through which the generated first reactive species R1 can move at least partially on a direct path from the reaction chamber 1 to the substrate 152. In particular, no structural obstruction is located along the virtual axis A from the orifice of the first inlet line 107 up to the carrier 155 for the substrate 152. The opening 336 in the redirection unit 332 is preferably elliptical, in particular circular and rotationally symmetrical about the virtual axis A.

The device according to the third embodiment is particularly suitable for the above-described refinement, according to which two three-way valves are arranged between the first and the second gas tanks 105, 106 and the first and second inlet lines 107, 108, so that gases from the first and from the second gas tank 105, 106 are introducible, in particular alternately, into both the first and also the second reaction chamber 101, 102.

Figure 4:
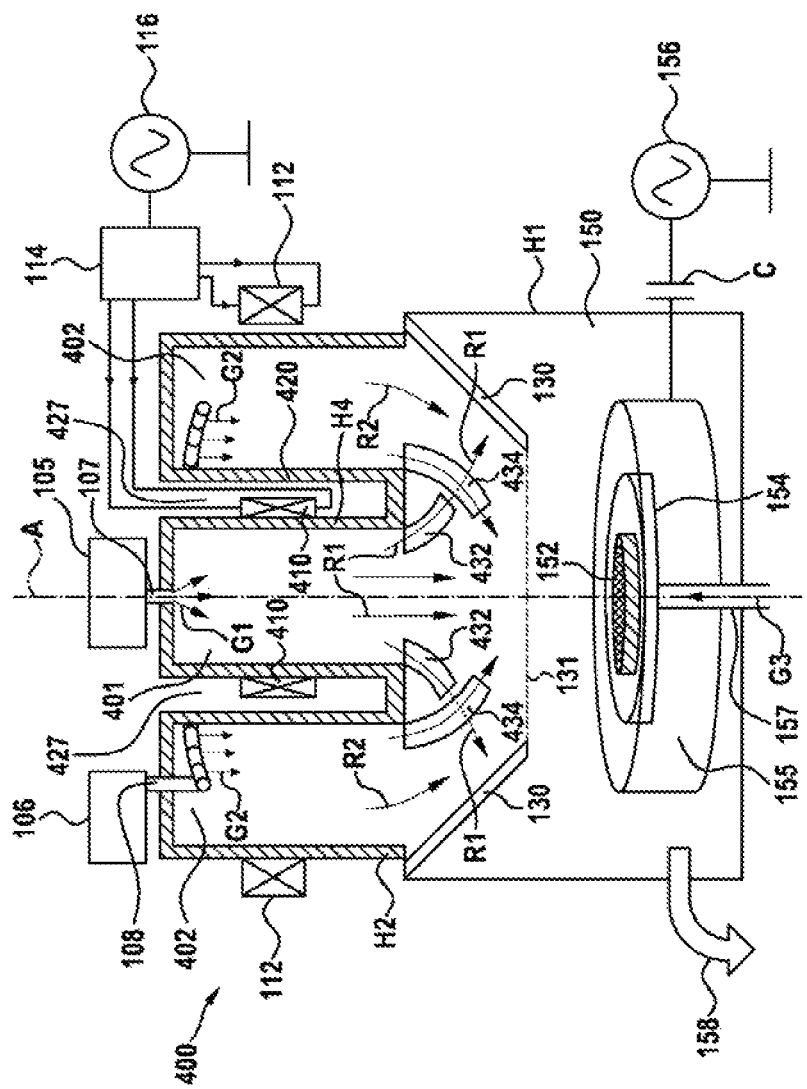
FIG. 4 shows a schematic cross-sectional view through a device for anisotropically etching a substrate according to a fourth embodiment of the disclosure.

FIG. 4 shows a schematic cross-sectional view through a device 400 for anisotropically etching a substrate 152 according to a fourth embodiment of the disclosure. The device 400 according to the fourth embodiment is a variant of the device 100 according to the first embodiment and differs therefrom in the shape and/or the arrangement of the first reaction chamber 401, the second reaction chamber 402, the mixing unit 430, 432, 434, and the first inductive coil 410 and the second inductive coil 112. The first inductive coil 410 is attached tangentially to the hollow cylinder H4 and is seated in a gap between individual walls forming the separating walls 420. The inductive coil 410 substantially generates the first plasma in the first reaction chamber 401 and additionally contributes to the plasma discharge in the second reaction chamber 402. The main excitation of the second plasma in the second reaction chamber 402 is performed by the second inductive coil 112.

The device 400 according to the fourth embodiment does not have a third hollow cylinder H3, which is extruded from a cover surface closing the second hollow cylinder H2, in the axial direction, at one end. Instead, the fourth hollow cylinder H4, which forms the separating unit 420, of the device 400 terminates flush in the axial direction at both ends with the axial end of the second hollow cylinder H2. In other words, the first reaction chamber 401 comprises, as the volume, the product of the height h4 of the fourth hollow cylinder, the number pi, and the square of the cylinder radius r1.

According to the fourth embodiment, the first inductive coil 410 is arranged on the lateral surface of the fourth hollow cylinder H4 in the gap between the separating walls 420. The powering of the first inductive coil 410 is performed by electrical feeds from the first coil 410 to the adaptation unit 114. The electrical feeds also extend in the gap between the individual walls forming the separating unit 420.

The mixing unit 130, 432, 434 of the device 400 has, in addition to the guide unit 130, a first redirection unit 432, which is arranged on the axial end of the fourth hollow cylinder H4 facing toward the etching chamber 150. The mixing unit 130, 432, 434 furthermore has a second redirection unit 434, which is arranged on the axial end of the second hollow cylinder H2 facing toward the etching chamber 150. The two redirection units 432, 434 can be fastened on the separating unit 420 or can be integrally formed with it.

The first redirection unit 432 comprises a plurality of tubular parts, which are designed to each conduct a part of the generated first reactive species R1 in the radial direction away from the virtual axis A, in particular additionally in the direction toward the carrier 155. The second redirection unit 434 comprises a plurality of tubular parts, which each conduct a part of the generated second reactive species R2 in the radial direction toward the virtual axis A, in particular additionally in the direction toward the carrier 155.

The tubular parts of the first redirection unit 432 leading toward the virtual axis A and the tubular parts of the second redirection unit 434 leading away from the virtual axis A alternate in this case along a circumference of a virtual circle, which is concentric with the virtual axis A and is perpendicular to the virtual axis A. The first and the second redirection units 432, 434 can have, jointly or each per se, a $C_n$ symmetry group with respect to the virtual axis A. Instead of the tubular parts, half tubular parts, i.e., tubular parts cut in half longitudinally, or other directors can also be used in accordance with the described arrangement.

Figure 5:
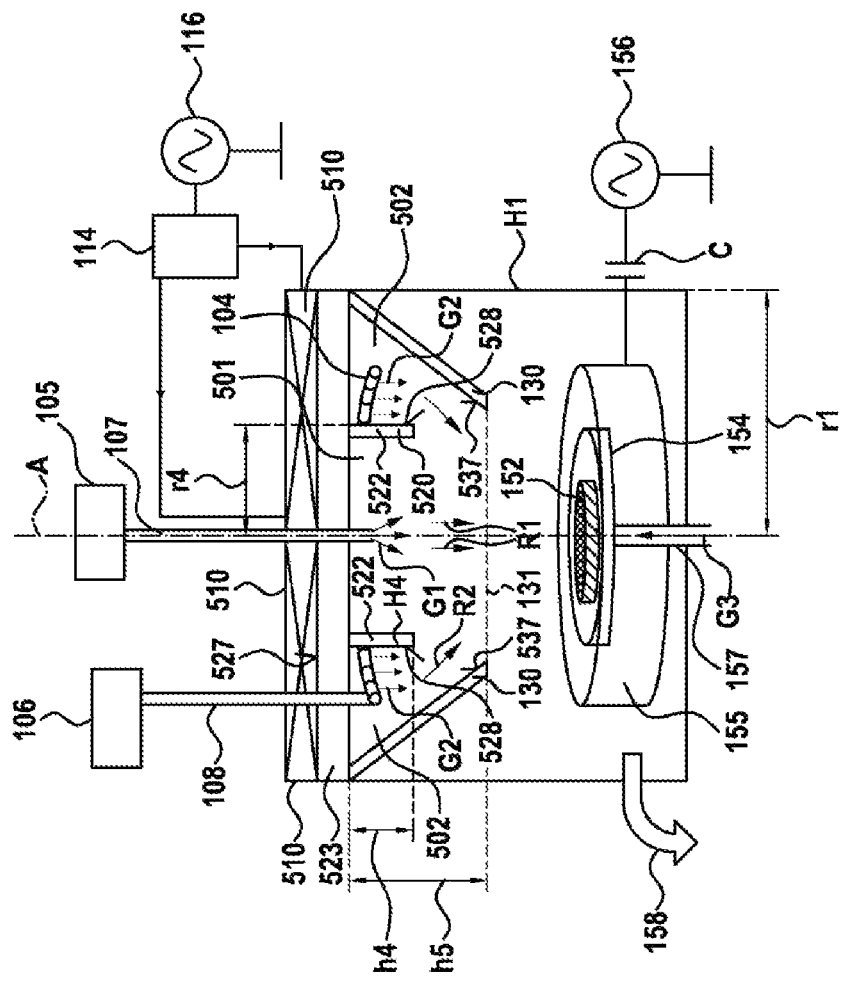
FIG. 5 shows a schematic cross-sectional view through a device for anisotropically etching a substrate according to a fifth embodiment of the disclosure.

FIG. 5 shows a schematic cross-sectional view through a device 500 for anisotropically etching a substrate 152 according to a fifth embodiment of the disclosure. The device 500 according to the fifth embodiment is a variant of the device 400 according to the fourth embodiment and differs therefrom in particular in the shape and/or the arrangement of the second reaction chamber 502, the mixing unit 130, and the inductive coil 510.

The device 500 does not have a second hollow cylinder H2 which is placed on the first hollow cylinder H1, but rather instead has a flat dielectric cover plate 523, for example, made of an aluminum oxide ceramic or of quartz glass, by means of which the first hollow cylinder H1 is closed at one axial end. A dielectric hollow cylinder H4 is suitably fastened on the cover plate or suspended thereon. The guide unit 130 adjoins below the cover plate 523. The guide unit 130 tapers, in a direction from the cover plate 523 toward the carrier 155, in a funnel shape from a circular radius equal to the cylinder radius r1 of the first hollow cylinder H1 to a smaller circular radius, which can be equal to the cylinder radius r4 of the fourth hollow cylinder H4, for example.

The first reaction chamber 501 and the second reaction chamber 502 are enclosed by the guide unit 130 both with respect to the extension thereof in the axial direction and also with respect to the extension thereof in the radial direction, in relation to the virtual axis A. In particular, the height h4 of the fourth hollow cylinder H4 is less than a height h5, in the axial direction, of the guide unit 130 in the form of a hollow truncated cone. The second reaction chamber 502 comprises a volume between an inner surface 537 of the guide unit 130 and an outer surface 528 of the lateral surface 522 of the fourth hollow cylinder H4.

Instead of the first and second inductive coils 410, 412, the device 500 only has a single inductive coil 510 embodied as a spiral-shaped flat coil. The inductive coil 510 is arranged on an external surface 527, which faces away from the etching chamber 150 in particular, of the dielectric cover surface 523, wherein passages through the coil 510 can be provided for the two inlet lines 107, 108. The coil 510 can be embodied as a continuous spiral-shaped coil. The coil 510 can also, however, be divided into an inner and an outer spiral-shaped partial coil L1, L2, which can also be powered independently of one another by means of the adaptation unit 114. In this case, the inner partial coil L1 can be designed to apply a first electromagnetic alternating field to the first reaction chamber 501 and the outer partial coil L2 can be designed to apply a second electromagnetic alternating field to the second reaction chamber 502.

Figure 7A:
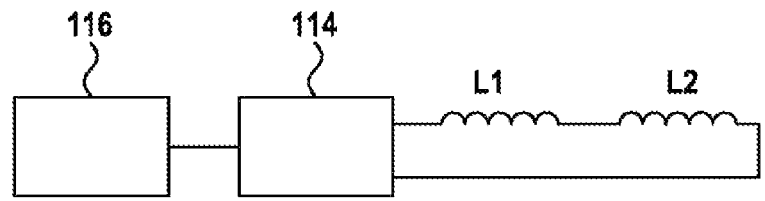
Figure 7B:
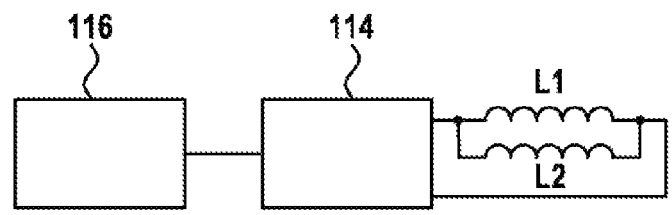
Figure 7C:
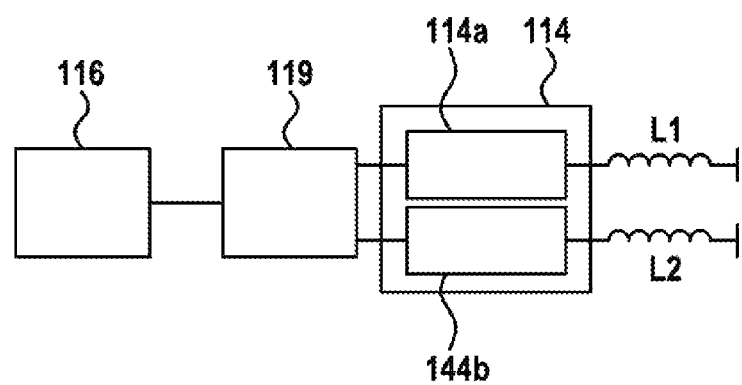
Figure 7D:
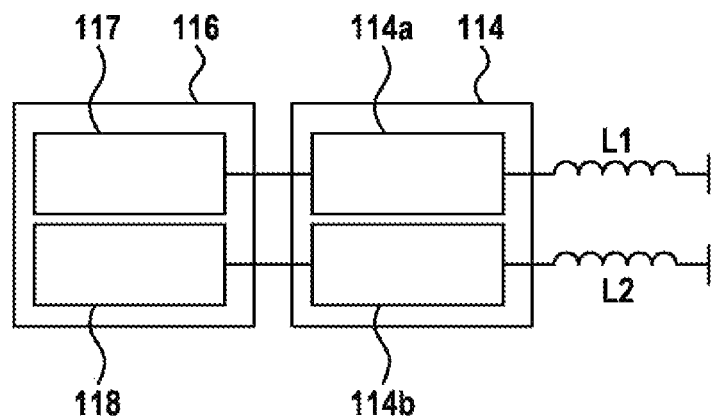
Figure 7E:
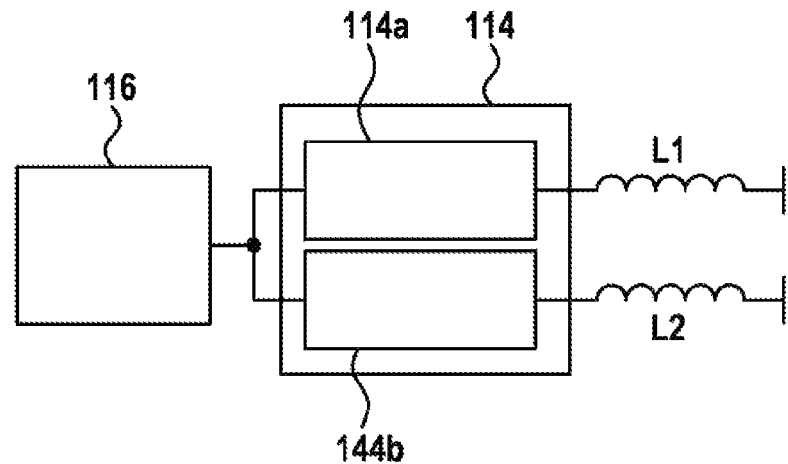
Figure 7F:
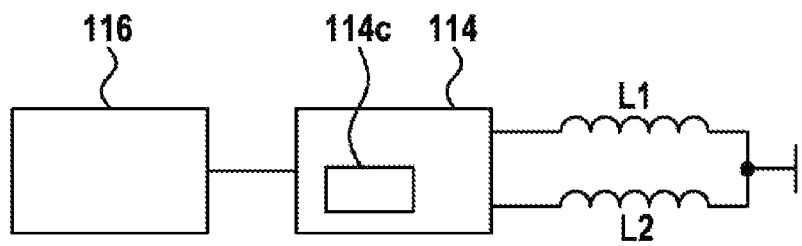

FIGS. 7a to 7f2 show various design forms of how a first partial coil L1 and a second partial coil L2 can be connected via an adaptation unit 114, which optionally has two partial adaptation units 114a, 114b, to the high-frequency generator unit 116 and can therefore be powered. The high-frequency generator unit can comprise one or two high-frequency AC voltage generators 117, 118, which are separate and independent of one another. A high-frequency splitter 119 is additionally used in FIG. 7c. FIGS. 7f1 and 7f2 show alternative design forms of the adaptation circuit 114c of the adaptation unit 114 shown in FIG. 7f. The adaptation circuit 114c has three capacitors C1, C2, C3, each having settable electrical capacitance.

Figure 6:
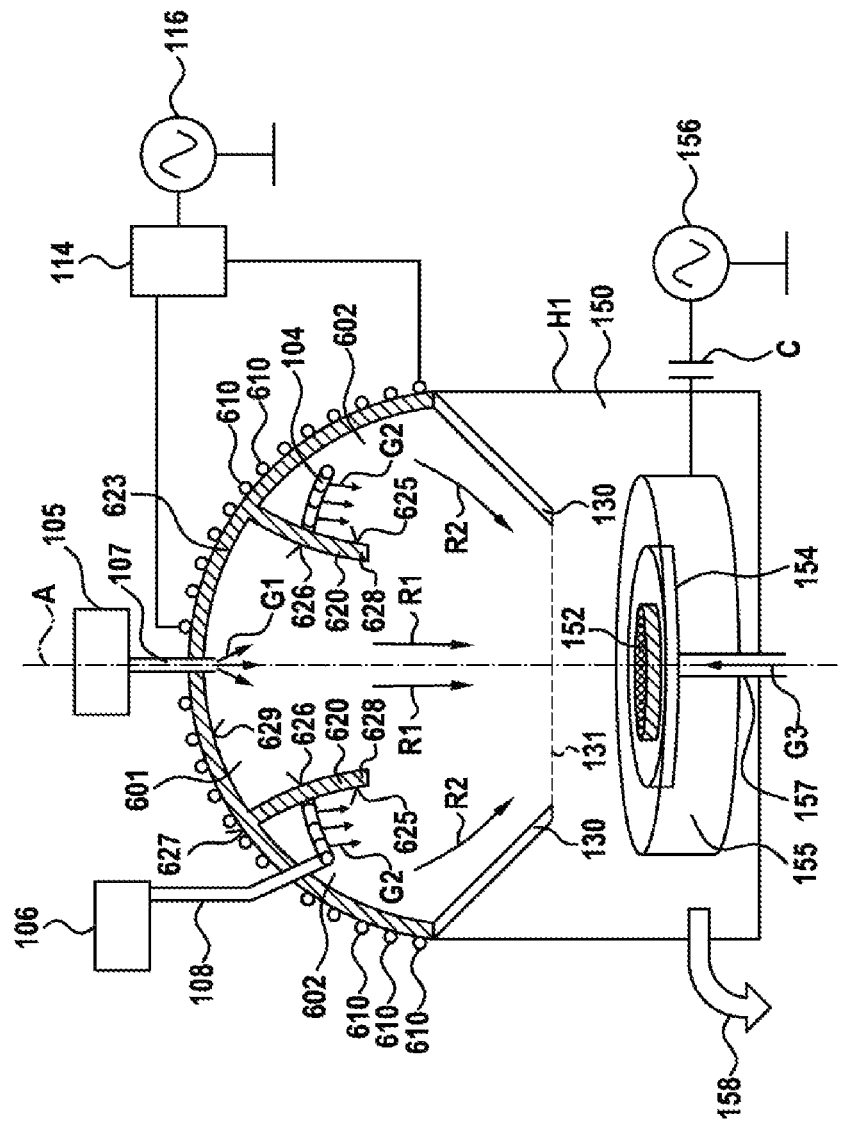
FIG. 6 shows a schematic cross-sectional view through a device for anisotropically etching a substrate according to a sixth embodiment of the disclosure.

FIG. 6 shows a schematic cross-sectional view through a device 600 for anisotropically etching a substrate 152 according to a sixth embodiment of the disclosure. The device 600 according to the sixth embodiment is a variant of the device 500 according to the fifth embodiment and differs therefrom in particular in the shape of the first and second reaction chambers 601, the mixing unit 130, and the inductive coil 610.

According to the device 600, instead of the flat dielectric cover plate 523 for covering the first hollow cylinder H1, a dielectric cover dome 623 is provided, which is formed from an aluminum oxide ceramic or from quartz glass, for example. To divide the volume located below the first hollow cylinder H1, which is enclosed by the cover dome 623, into a first and second reaction chamber 601, 602, a separating unit 620, which is rotationally symmetrical about the virtual axis A, is formed and/or suitably fastened to the cover dome 623 or suspended thereon on an internal surface 629 of the cover dome 623, which faces toward the etching chamber 150.

The separating unit 620 has separating walls 628, which extend in the direction of the etching chamber 150 and are concavely curved with respect to the virtual axis A. The separating walls can be formed in one piece with the cover dome 623, but can also be attached to the cover dome 623, for example, by means of welding or suspension. The first reaction chamber 601 comprises the volume inside an inner surface 262 of the separating walls 628 of the separating unit 620. The second reaction chamber 602 comprises the volume which is positioned both outside an outer surface 625 of the separating walls 628 of the separating unit 620 and also inside the internal surface 629 of the cover dome 623.

In the device 600, the two reaction chambers 601, 602 are located completely outside the first hollow cylinder H1, while the guide unit 130 is arranged completely inside the first hollow cylinder H1. The inductive coil 610, like the inductive coil 510 according to the fifth embodiment, is formed as spiral-shaped, however, in contrast to the coil 510, it is not flat, but rather in a dome shape along an external surface 627 of the cover dome 623, wherein the external surface 627 faces away from the etching chamber 150.

The coil 610, like the coil 510, can also be embodied as a continuous coil, but can also be divided into an inner and an outer partial coil L1, L2, which can also be powered independently of one another by means of the adaptation unit 114. In this case, the inner partial coil L1 can be designed to apply the first electromagnetic alternating field to the first reaction chamber 601 and the outer partial coil L2 can be designed to apply the second electromagnetic alternating field which to the second reaction chamber 602. The inner and the outer partial coils L1, L2 and the adaptation unit 114 can be designed according to the design forms shown in FIGS. 7a to 7f2, for example, and can be powered separately and independently of one another with high-frequency power, for example.

Figure 8:
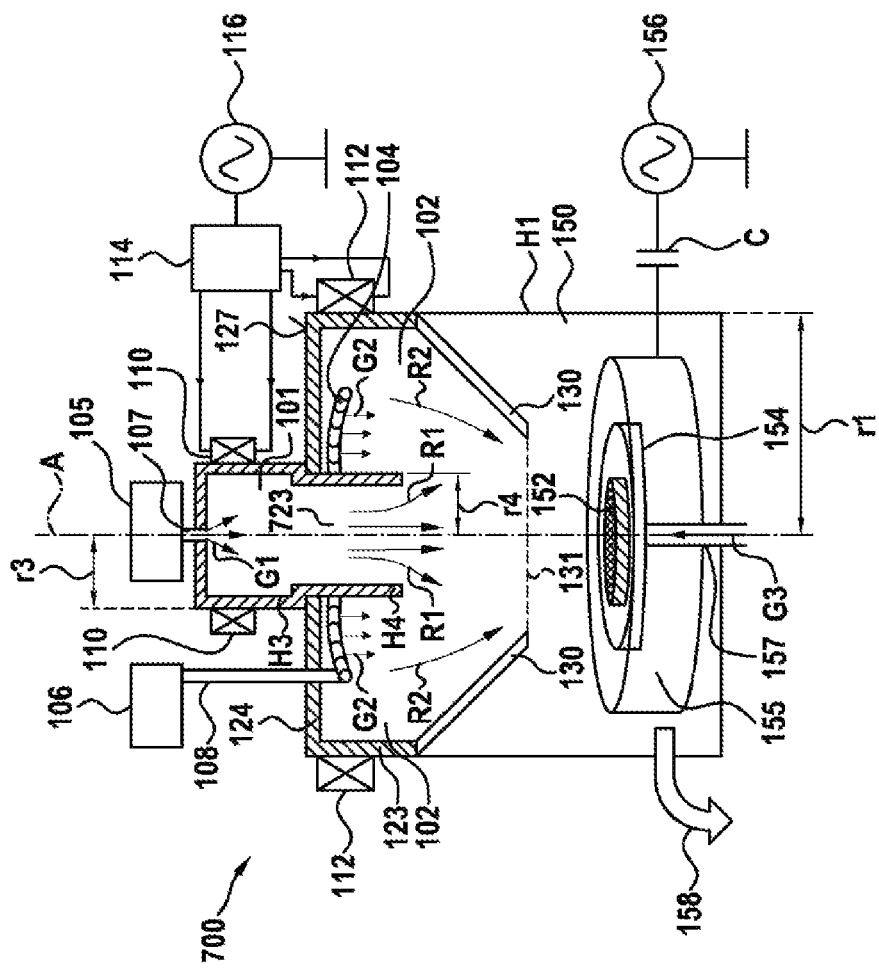
FIG. 8 shows a schematic cross-sectional view through a device for anisotropically etching a substrate according to a seventh embodiment of the disclosure.

FIG. 8 shows a schematic cross-sectional view through a device 700 for anisotropically etching a substrate 152 according to a seventh embodiment of the disclosure. The device 700 according to the seventh embodiment is a variant of the device 100 according to the first embodiment and differs therefrom in the shape of the mixing unit 130, and of the third hollow cylinder H3 and the fourth hollow cylinder H4.

According to the seventh embodiment, the third hollow cylinder H3 and the fourth hollow cylinder H4 are integrally formed or assembled and are inserted into a circular opening 723, which is rotationally symmetrical about the virtual axis A, in the circular ring disk 124 such that the fourth hollow cylinder H4 for separating the first and the second reaction chamber 101, 102 protrudes through the circular ring disk 124, while the third hollow cylinder H3 partially presses against an external surface 127, which faces away from the etching chamber 150, of the circular ring disk 124 to form a seal. Furthermore, according to the seventh embodiment, the cylinder radius r3 of the third hollow cylinder H3 is larger than the cylinder radius r4 of the fourth hollow cylinder H4, which are both smaller than the cylinder radius r1 of the first hollow cylinder H1. The device 700 only has the guide unit 130 as the mixing unit. In a variant (not shown) of the seventh embodiment, the fourth hollow cylinder H4 can also be completely omitted, i.e., the separation of the two reactive species in the region of the second reaction chamber 102 therefore takes place exclusively via the spatial distance between the gas exit from the vessel which the third hollow cylinder H3 forms, on the one hand, and the second inductive coil 112 or the second reaction chamber 102, on the other hand, and/or by separating the gas flows from the gas distributor ring 104, on the one hand, and the third hollow cylinder H3, on the other hand, and/or by the kinetics of the initially separately flowing gases or species.

The device 700 according to the seventh embodiment can be operated using the following first parameter set, for example: a pressure in the reaction chambers 101, 102 and the etching chamber 150 of between 3 and 20 Pa, preferably between 6 and 8 Pa, particularly preferably 6.5 Pa; a power applied to the first inductive coil 110 of 2500 W; a power applied to the second inductive coil 112 of 1700 W; an AC voltage applied to the carrier 155 having a power of 50 W and a frequency of 13.56 MHz; a pressure of the helium gas in the cooling feed line 157 of between 1 and 3 Pa, preferably 2 Pa; a temperature of the carrier 155 of 25° C.; octafluorocyclobutane as the first gas G1 having a flow through the first inlet line 107 of 200 standard cubic centimeters per minute; and sulfur hexafluoride as the second gas G2 having a flow through the second inlet line 108 of 500 standard cubic centimeters per minute. The standard cubic centimeter is a gas volume of 1 cm$^3$ under the so-called physical standard conditions according to DIN 1343 and is convertible via the standard density approximately into one mole flow per second.

A second parameter set, using which the device 700 according to the seventh embodiment is operable, differs from the first parameter set in that AC voltage applied to the carrier 155 has a power of 25 W and the temperature of the carrier 155 is 50° C. and/or is temperature controlled thereto.

Figure 9:
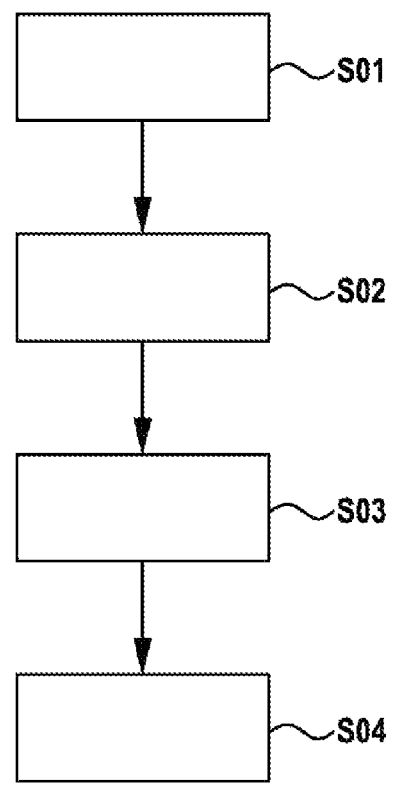
FIG. 9 shows a schematic flow chart to explain a method for operating a device according to the disclosure.

FIG. 9 shows a schematic flow chart to explain a method for operating a device 100; 200; 300, 400, 500; 600; 700 according to the disclosure.

In a step S01, the first gas G1 is introduced into the first reaction chamber 101; 401; 501; 601. In a step S02, the second gas G2 is introduced into the second reaction chamber 102; 402; 502; 602, simultaneously with the introduction of the first gas G1 into the first reaction chamber 101; 401; 501; 601. In a step S03, at least one electromagnetic alternating field is generated to generate the reactive species R1 from the first gas G1 and to generate the second reactive species R2 from the second gas G2. In a step S04, the first high-frequency AC voltage is applied to the carrier 155 to accelerate the electrically charged particles generated in the plasma zones, the so-called ions, toward the substrate 152.

Details of the method according to the disclosure and the preferred refinements thereof can also be inferred from the above descriptions of the device according to the disclosure and the preferred refinements and variants thereof. The method according to the disclosure is adaptable accordingly to be carried out with any embodiment of the device.

Although the disclosure was described above on the basis of preferred exemplary embodiments, it is not restricted thereto, but rather is modifiable in a variety of ways. In particular, the disclosure may be altered or modified in manifold ways without deviating from the core of the disclosure. For example, the mixing units which are described on the basis of various embodiments and the redirection units thereof can also be combined with one another or replaced by one another. In particular, different plasma sources or vessel arrangements can be combined with arbitrary mixing units, notwithstanding the exemplary embodiments shown. As the simplest variant of a mixing unit, a mere diffusion section between the plasma sources and the location of the silicon wafer can also be used. In this case, diffusion section means a path section via which the two gases or reactive species flow jointly in the direction of the substrate, i.e., the etching chamber, after leaving the generation regions thereof, wherein mixing of the two reactive species takes place by interdiffusion processes along this path.

The invention claimed is:

1. A device for anisotropically etching a substrate, comprising: a first reaction chamber configured to receive a first gas; a second reaction chamber configured to receive a second gas;
   at least one coil unit configured to generate at least one electromagnetic alternating field in the first and second reaction chambers, wherein the at least one coil unit is configured such that the at least one electromagnetic alternating field generated in the first reaction chamber excites the first gas in the first reaction chamber so as to produce at least one first reactive species, and the at least one electromagnetic alternating field generated in the second reaction chamber excites the second gas in the second reaction chamber so as to produce at least one second reactive species;
   a separating unit configured to prevent or to suppress a direct gas exchange between the first reaction chamber and the second reaction chamber, the separating unit configured as a hollow cylinder inserted into the second reaction chamber, and the separating unit coaxial with the first reaction chamber and extending from the first reaction chamber;
   an etching chamber configured to accommodate the substrate to be anisotropically etched; and
   a mixing unit arranged downstream of the first reaction chamber and the second reaction chamber in a direction toward the etching chamber and configured such that the generated at least one first reactive species and the generated at least one second reactive species mix with one another in the mixing unit outside of the first and second reaction chambers and enter the etching chamber for anisotropically etching the substrate while mixed with one another,
   wherein the mixing unit has at least one redirection unit that partially or completely blocks a direct path of the generated at least one first reactive species from the first reaction chamber to the substrate to redirect at least a part of the generated at least one first reactive species, and
   wherein the at least one redirection unit is arranged at least partially downstream of a lowermost end of the hollow cylinder so as to deflect the at least one first reactive species radially outwardly such that the at least one first reactive species mixes with the at least one second reactive species.

2. The device as claimed in claim 1, wherein the mixing unit has a guide unit, which tapers in a funnel shape in the direction of the etching chamber and is configured to guide the at least one first reactive species and at least one second reactive species, which are mixed with one another, to the substrate, the guide unit arranged downstream of the second reaction chamber so as to deflect the at least one second reactive species radially inwardly such that the at least one second reactive species mixes with the at least one first reactive species.

3. The device as claimed in claim 1, wherein the mixing unit is configured as a diffusion section.

4. The device as claimed in claim 1, wherein at least one first subregion of the first reaction chamber is completely enclosed by at least one second subregion of the second reaction chamber.

5. The device as claimed in claim 1, wherein:
the coil unit has a first inductive coil configured to apply a first electromagnetic alternating field to the first reaction chamber; and
the coil unit furthermore has a second inductive coil configured to apply a second electromagnetic alternating field to the second reaction chamber.

6. The device as claimed in claim 1, wherein:
the first reaction chamber has a first inlet line configured to introduce the first gas into the first reaction chamber, the first inlet line is connected via a first valve unit to a first gas tank and to a second gas tank, and the first valve unit is configured to introduce either a first gas species provided in the first gas tank or a second gas species provided in the second gas tank as the first gas into the first reaction chamber; and
the second reaction chamber has a second inlet line configured to introduce the second gas into the second reaction chamber, the second inlet line is connected via a second valve unit to the first gas tank and to the second gas tank, and the second valve unit is configured to introduce either the first gas species provided in the first gas tank or the second gas species provided in the second gas tank as the second gas into the second reaction chamber.

7. The device as claimed in claim 1, further comprising:
a temperature-control unit configured to bring the substrate to a predefined operating temperature between 20° C. and 90° C., each inclusive, and to hold the substrate at the predefined operating temperature.

8. The device as claimed in claim 1, wherein:
the first gas is a passivation gas or an etching gas;
the second gas is an etching gas if the first gas is a passivation gas;
the second gas is a passivation gas if the first gas is an etching gas;
the passivation gas is a fluorinated hydrocarbon, a perfluorinated alkene, a perfluorinated alkyne, or a cyclic perfluorinated alkane; and
the etching gas is a fluorine-supplying gas.

9. The device as claimed in claim 8 wherein:
the passivation gas is hexafluoropropene or octafluorocyclobutane; and
the etching gas is sulfur hexafluoride or nitrogen trifluoride.

10. The device as claimed in claim 1, wherein the etching chamber includes a substrate support surface having a substrate support region configured to support the substrate, and the at least one redirection unit partially or completely blocks a direct path of the generated at least one first reactive species from the hollow cylinder to the substrate support region.

* * * * *